(12) United States Patent
Waltho

(10) Patent No.: US 7,209,082 B2
(45) Date of Patent: Apr. 24, 2007

(54) METHOD AND APPARATUS FOR A DUAL BAND GAP WIDEBAND INTERFERENCE SUPPRESSION

(75) Inventor: Alan E. Waltho, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 11/171,090

(22) Filed: Jun. 30, 2005

(65) Prior Publication Data

US 2007/0001926 A1  Jan. 4, 2007

(51) Int. Cl.
*H01Q 1/38* (2006.01)
*H01Q 15/02* (2006.01)
*H01Q 15/24* (2006.01)

(52) U.S. Cl. .............................. 343/700 MS; 343/909
(58) Field of Classification Search ......... 343/700 MS, 343/756, 846, 909, 912
See application file for complete search history.

(56) References Cited

U.S. PATENT DOCUMENTS 6,262,495 B1    7/2001  Yablonovitch et al.
6,483,481 B1*  11/2002  Sievenpiper et al. ........ 343/909
6,512,494 B1*   1/2003  Diaz et al. .................. 343/909
2003/0231142 A1  12/2003  McKinzie, III et al.
2004/0119658 A1   6/2004  Waltho
2005/0029632 A1*  2/2005  McKinzie et al. .......... 257/665
2006/0092093 A1*  5/2006  Choi et al. .................. 343/909

OTHER PUBLICATIONS

Ramesh Abhari and George V. Eleftheriades, "Metallo-Dielectric Electromagnetic Bandgap Structures for Suppression and Isolation of the Parallel-Plate Noise in High-Speed Circuits", IEEE Transactions on Microwave Theory and Techniques, vol. 51, No. 6, Jun. 2003. pp. 1629-1639.

Sievenpiper, Dan et al. "High-Impedance Electromagnetic Surfaces with a Forbidden Frequency Band", IEEE Transactions on Microwave Theory and Techniques, vol. 47, No. 11, Nov. 1999. pp. 2059-2074.

\* cited by examiner

*Primary Examiner*—Shih-Chao Chen
(74) *Attorney, Agent, or Firm*—Buckley, Maschoff & Talwalkar LLC

(57) ABSTRACT

A method and apparatus including, in some embodiments, a first conductor plane, a first array of periodically distributed co-planar conductive patches, each patch in the first array being connected to the first conductor plane, a second conductor plane separated from and parallel to the first conductor plane, and a second array of periodically distributed co-planar conductive patches, with each patch in the second array being connected to the second conductor plane, and where the first array and second array of periodically distributed co-planar elements are distributed in an overlapping and alternating adjacency.

23 Claims, 5 Drawing Sheets

400

405 — PROVIDE A FIRST FREQUENCY SELECTIVE EBG COMPRISING A FIRST ARRAY OF PERIODICALLY DISTRIBUTED CO-PLANAR CONDUCTIVE PATCHES

410 — CONNECT EACH PATCH OF THE FIRST EBG TO A FIRST CONDUCTOR PLANE

415 — PROVIDE A SECOND FREQUENCY SELECTIVE EBG COMPRISING A SECOND ARRAY OF PERIODICALLY DISTRIBUTED CO-PLANAR CONDUCTIVE PATCHES

420 — CONNECT EACH PATCH OF THE SECOND EBG TO A SECOND CONDUCTOR PLANE THAT IS SEPARATED FROM AND PARALLEL TO THE FIRST CONDUCTOR PLANE, WHEREIN THE PATCHES OF THE FIRST EBG AND THE SECOND EBG ARE ARRANGED IN AN OVERLAPPING AND ALTERNATING ADJACENCY

FIG. 4

METHOD AND APPARATUS FOR A DUAL BAND GAP WIDEBAND INTERFERENCE SUPPRESSION

BACKGROUND

Electronic packaging and operating environments may have both digital circuits and analog circuits, including single or multiple RF circuits, which may be in close proximity with each other. In an attempt to isolate digital and analog/RF and RF to RF circuits, power and ground planes for the circuits may be separated in split power and ground planes. In some electronic packaging environments, such as, for example, multilayer printed circuit boards (PCB), noise may be experienced on parallel ground and power planes of the PCB as a result of circuit excitation. In some electronic packaging and operating environments that include RF circuits, an RF signal from an RF transmitter or RF noise from a digital circuit may be propagated along the power plane and/or the ground plane.

Accordingly, a method and apparatus to efficiently suppress RF interference and other unwanted noise may be desired in mixed signal electronic packaging and operating environments.

BRIEF DESCRIPTION OF THE DRAWINGS

FIG. 4 is an flow diagram, according to some embodiments herein; and

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
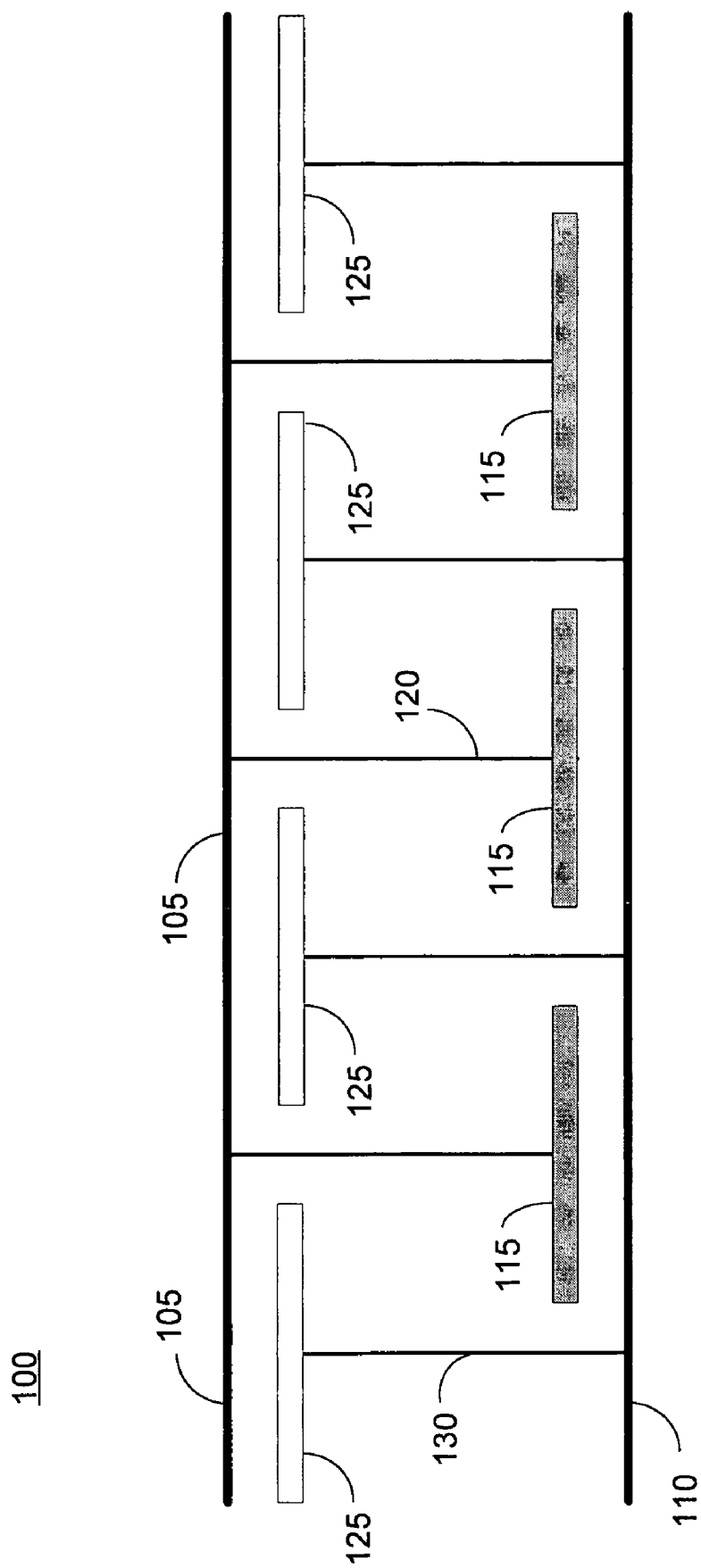
FIG. 1 is a side view of an apparatus, according to some embodiments herein.

FIG. 1 is an exemplary apparatus 100, in accordance with some embodiments herein. Apparatus 100 includes a number of co-planar conductive patches 115. Patches 115 may be constructed of a conductive material such as, for example, copper and other metals. Patches 115 comprises an array of periodically distributed elements. Patches 115 are capacitively connected to each other and to a common ground plane and inductively connected to a common conductor plane 105. Also, apparatus 100 includes a number of co-planar conductive patches 125. Patches 125 may be constructed of a conductive material and form an array of periodically distributed elements. Patches 125 are capacitively connected to each other and to a common ground plane and inductively connected to a common conductor plane 110.

Patches 115 are connected to conductor plane 105 by a conductive line 120 and patches 125 are connected to conductor plane 110 by a conductive line 130. The conductive line may be metallizations formed in vias through layers of a PCB.

The arrays of patches 125 and patches 115 are arranged such that adjacent patches 115 and 125 alternate. That is, neighboring patches alternate between patches 115 from a first array and patches 125 from another, second array. Also, the arrays comprising patches 115 and patches 125 are separated from each other and occupy parallel planes. For example, patches 115 occupy a lower plane, closer to conductor plane 110 and patches 125 occupy an upper plane, closer to conductor plane 105. Patches 115 and patches 125 may also overlap each other.

Patches 115 and 125 are arranged in an overlapping and alternating adjacency. The array of periodically distributed co-planar conductive patches 115 forms an electromagnetic band gap (EBG) structure and the array of periodically distributed co-planar conductive patches 125 forms another EBG structure. Accordingly, apparatus 100 comprises a dual EBG device having two EBG structures arranged back-to-back.

Figure 2:
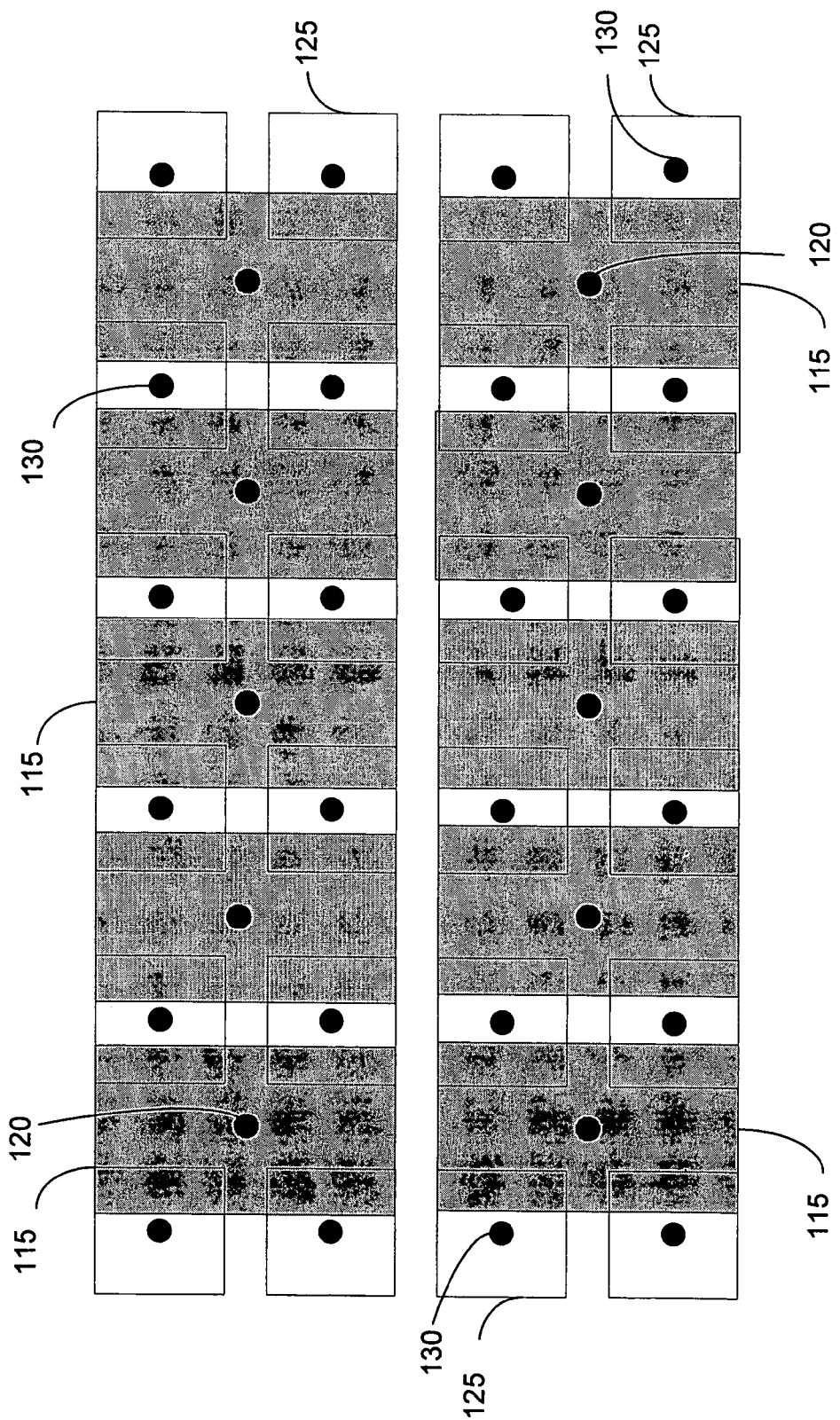
FIG. 2 is a top plan view of an apparatus, according to some embodiments herein.

FIG. 2 is an illustrative view of the dual EBG structure 100, in accordance with some embodiments herein. Conductor planes 105 and 110 are not shown in FIG. 2 for purposes of clarity in illustrating other aspects of dual EBG structure 100. As shown, lower patches 115 and upper patches 125 overlap each other, at least partially. Also, it is clear that patches 115 repeat periodically, as do patches 125. Again, conductive lines 120 (e.g., vias) are provided to connect patches 115 to a conductor plane (not shown) and conductive lines 130 (e.g., vias) are provided to connect patches 125 to a conductor plane (not shown).

In some embodiments herein, each of the EBG structures herein comprises a resonant structure operative that may substantially block a surface current propagation within a predetermined frequency band gap. The frequency band gap may be determined consistent with EBG structure parameters, as understood by those skilled in the art. In some embodiments herein, a lower cutoff frequency for one of the dual EBG structures is tuned to coincide with an upper cutoff frequency of the other EBG structure. For example, one EBG of dual EBG structure 100 may have a resonant bandwidth from about 800 Mhz to about 1600 Mhz and the other EBG of the dual EBG structure may have a resonant bandwidth from about 1600 Mhz to about 3200 Mhz. In this manner, an overall bandwidth over which the dual EBG structure hereof may suppress signals (e.g., interference signals in mixed signal environments) may be 4:1.

It is noted that a single EBG may achieve signal suppression over a bandwidth on an order of about 2:1. Thus, in some embodiments herein, an improvement may be realized using a dual EBG structure hereof. In some embodiments, a dual EBG structure in accordance with some embodiments herein may suppress interference signals from about 2.4 Ghz to about 10.0 Ghz, including frequencies of about 2.4 Ghz to about 5.0 Ghz for WLAN (i.e., wireless lans), as well as UWB (ultra-wide band) frequencies. Other covered frequency bandwidths may include frequency ranges from about 800 Mhz to about 3.2 Ghz.

Figure 3:
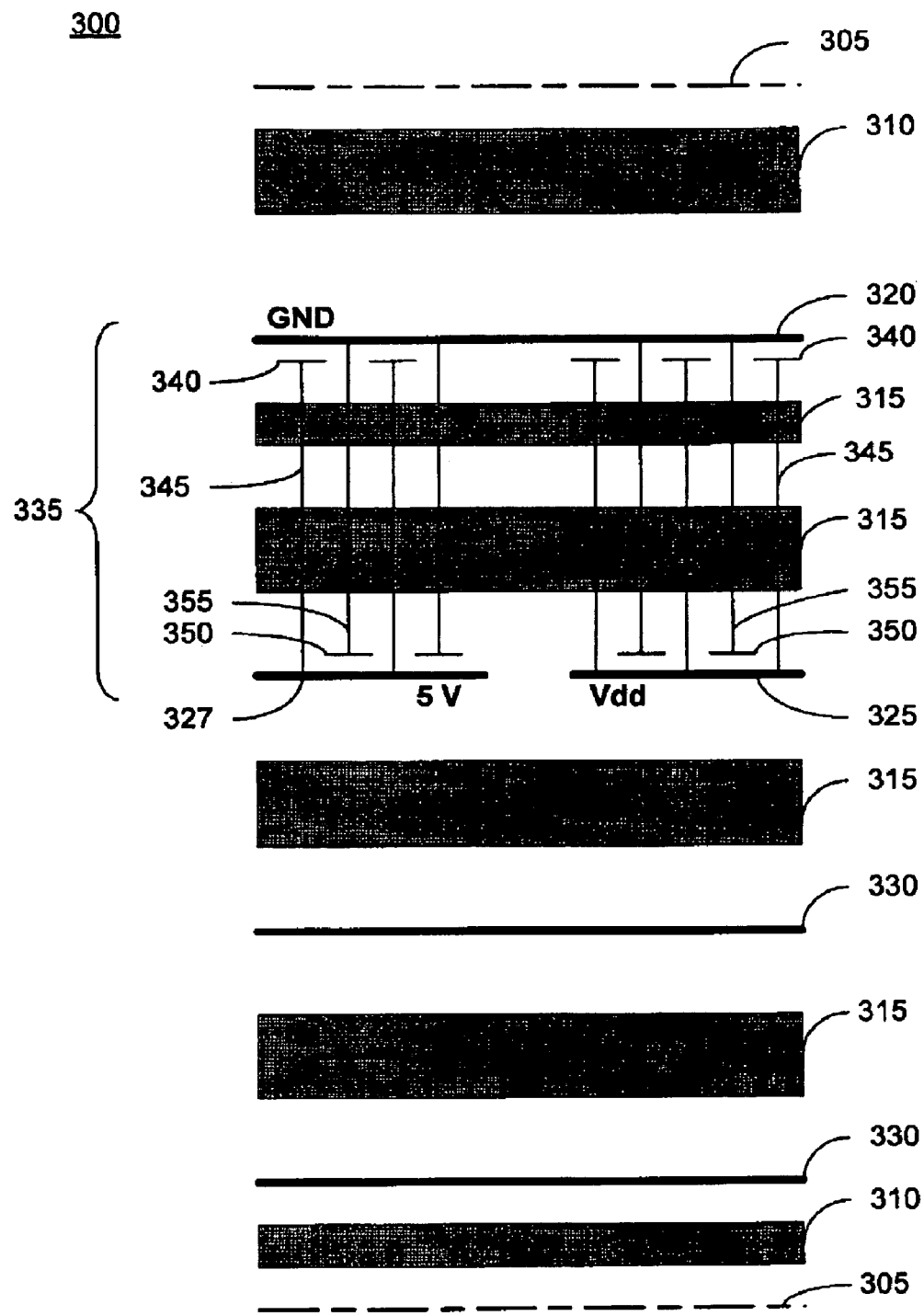
FIG. 3 is an illustrative diagram of an apparatus, according to some embodiments herein.

FIG. 3 is an illustrative example of a PCB 300 including a dual EBG structure, in accordance with some embodiments herein. PCB 300 is a multilayer PCB including a number of laminated layers. The laminated layers comprise alternating layers of dielectric material and conductors, including prepreg 310 with conductive signal layers 305 and layers of core material 315 separated by conductive planes 320, 325, 327, and 330. PCB 300 may be fabricated using, for example, known PCB materials and processes.

Dual EBG structure 335 may include a first EBG structure comprising co-planar patches 340 that are connected to conductor planes 325 and 327 by conductive vias 345 and a second EBG comprising co-planar patches 350 that are connected to a ground plane 320. The vias connecting patches 340 and 350 to the respective conductor planes may be fabricated per known PCB fabrication techniques and processes. Ground plane 320 may be at a ground potential and conductor plane 327 may be at 5 volts and conductor plane 325 may be at 2.5 volts (Vdd). Dual EBG structure 335 may suppress surface signals and interference between ground plane 320 and conductor planes 327 and 325. The surface signals may be a result of, for example, RF signals in a multiple RF signal environment, and RF noise resulting from high speed digital devices in a mixed signal environment, and analog induced interference.

Dual EBG structure 335 may have patches 340 and 350 sized and spaced apart from conductor planes 340, 325, and 327 to suppress frequencies in a specific bandwidth, in accordance with EBG design considerations. Thus, the frequency suppression characteristics of the dual EBG structures comprising the dual EBG structure may be determined based on the design parameters thereof to provide a frequency selective EBG.

Surface waves may propagate over a surface of parallel plates 320, 325, and 327. Operationally, dual EBG structure 335 may suppress signals on conductor planes 320, 325, and 327 in all directions within the operative bandwidth of the dual EBG structure. That is, the signal suppression functionality of dual EBG structure 335 may operate to suppress signals omni-directionally.

FIG. 4 is a flow diagram of a process 400, in accordance with some embodiments herein. At operation 405, a first frequency selective EBG is provided. The first frequency selective EBG may include a first array of periodically distributed co-planar patches. Each of the co-planar patches of the first array are attached to a common conductor plane at operation 410.

At operation 415, a second frequency selective EBG is provided. The second frequency selective EBG may include a second array of periodically distributed co-planar patches.

At operation 420, each of the co-planar patches of the second array are attached to a common conductor plane that is parallel to and separated from the first conductor plane. The patches of the first EBG and the second EBG may be arranged in an alternating and overlapping adjacency, as illustrated in FIGS. 1 and 2.

Process 400 may be used to suppress or attenuate signals within a specific bandwidth between the parallel first and second conductors. The effective bandwidth of the dual EBG structure provided in accordance with some embodiments herein, including process 400, may be a combination of the bandwidths of the first EBG and the second EBG.

Figure 5:
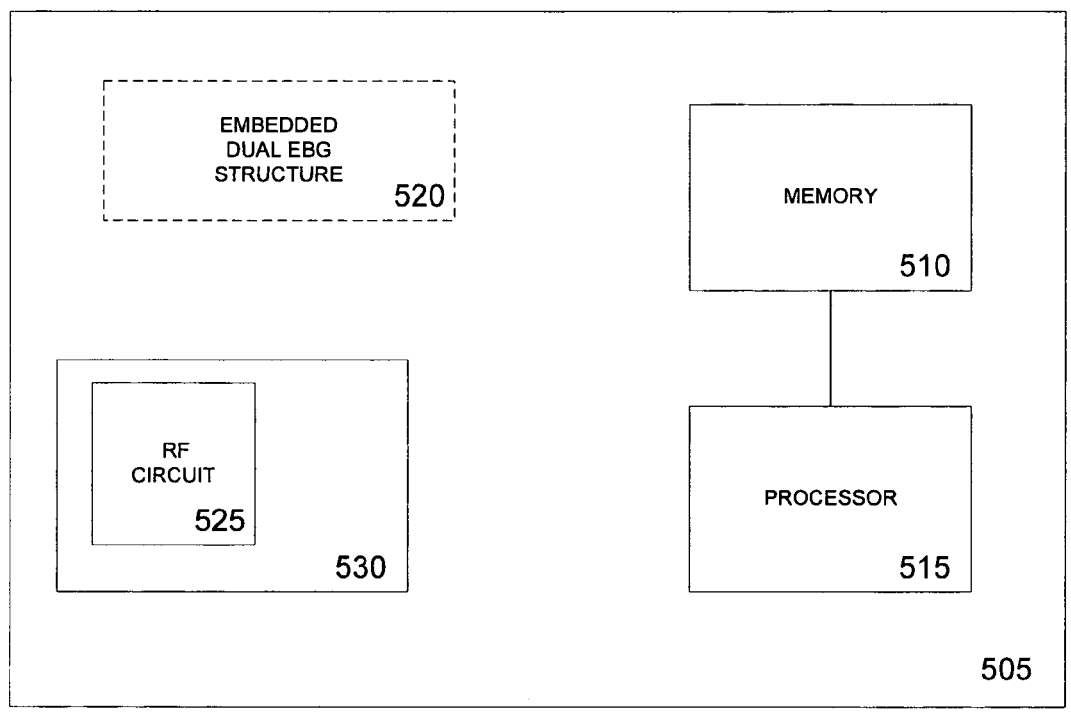
FIG. 5 is an exemplary system, in accordance with some embodiments herein.

FIG. 5 is an exemplary system 500 including a dual EBG, in accordance with some embodiments herein. System 500 includes a PCB 505. PCB 505 may have a number of devices connected thereto, including a memory 510, a processor 515, and RF circuit 525. RF circuit may transmit and receive RF signals. RF circuit 525 may be mounted to a daughterboard 530.

Embedded in the layers of PCB 505 may be a dual EBG structure 520, in accordance with some embodiments herein. Dual EBG structure 520 may operate to suppress signals (e.g., interference) between parallel conductor layers of PCB 505. At least some of the signals between parallel conductor layers of PCB 505 may be induced by RF circuit 525. Dual EBG structure 525 may be operative to attenuate or suppress the signals caused by, for example, RF circuit 520 between parallel conductors of PCB 505 within an operational bandwidth of the dual EBG structure.

Dual EBG structure 520 may function as a planar bandstop filter. Dual EBG structure 520 may block RF noise currents in parallel ground and power planes. Dual EBG structure 520 may provide unidirectional suppression of the noise in the ground and power planes. In some embodiments, dual EBG structure 520 may suppress unwanted RF surface currents. In some embodiments, dual EBG structure 520 may decouple, for example, the ground plane and the power plane to suppress interference therebetween.

The foregoing disclosure has been described with reference to specific exemplary embodiments thereof. It will, however, be evident that various modifications and changes may be made thereto without departing from the broader spirit and scope set forth in the appended claims.

What is claimed is:

1. An apparatus, comprising:
   a first conductor plane;
   a first array of periodically distributed co-planar conductive patches, each patch in the first array being connected to the first conductor plane;
   a second conductor plane separated from and parallel to the first conductor plane, wherein the second conductor plane includes two or more co-planar conductor planes physically separated from each other; and
   a second array of periodically distributed co-planar conductive patches, each patch in the second array being connected to the second conductor plane, wherein the first array and second array of periodically distributed co-planar patches are distributed in an overlapping and alternating adjacency.

2. The apparatus of claim 1, wherein the first array forms a first frequency selective electromagnetic band gap (EBG) that operates to suppress frequencies in a first frequency band, and the second array forms a second frequency selective EBG that operates to suppress frequencies in a second frequency band.

3. The apparatus of claim 2, wherein the frequency suppressions substantially reduce a propagation of a surface wave signal, omni-directionally, on the first and second conductor planes.

4. The apparatus of claim 2, wherein the first frequency band and the second frequency band differ from each other.

5. The apparatus of claim 2, wherein the first frequency band and the second frequency band have a bandwidth of a and b, respectively.

6. The apparatus of claim 5, wherein the first and second frequency selective EBGs together operate to suppress signals between the first and second conductor planes in a bandgap of a+b.

7. The apparatus of claim 1, wherein at least one of the first and second conductor planes is selected from the group consisting of a ground plane, a power plane, and a conductor layer in a multilayer printed circuit board.

8. The apparatus of claim 1, wherein each of the patches of the first and second arrays is connected to the respective first and second conductor planes by a conducting line.

9. The apparatus of claim 8, wherein the conductive line is a conductive via.

10. The apparatus of claim 1, further comprising a dielectric located between the first and second conductor planes.

11. A method to suppress propagation of a signal within a frequency band, the method comprising:
   providing a first frequency selective electromagnetic band gap (EBG) comprising a first array of periodically distributed co-planar conductive patches;

connecting each patch of the first EBG to a first conductor plane;

providing a second frequency selective electromagnetic band gap (EBG) comprising a second array of periodically distributed co-planar conductive patches; and connecting each patch of the second EBG to a second conductor plane that is separated from and parallel to the first conductor plane, wherein the second conductor plane includes two or more co-planar conductor planes physically separated from each other, and the patches of the first EBG and the second EBG are arranged in an overlapping and alternating adjacency, and the first and second EBGs operate to suppress propagation of a signal on the first and second conductor planes within a predetermined frequency band.

12. The method of claim 11, wherein the frequency suppression substantially reduces a propagation of the signal omni-directionally throughout the first or second conductor planes.

13. The method of claim 11, wherein the first frequency band and the second frequency band differ from each other.

14. The method of claim 11, wherein the first frequency band and the second frequency band have a bandwidth of a and b, respectively.

15. The method of claim 14, wherein the first and second frequency selective EBGs together operate to suppress signals between the first and second conductor planes in a bandgap of a+b.

16. The method of claim 11, wherein at least one of the first and second conductor planes is selected from the group consisting of a ground plane, a power plane, and a conductor layer in a multilayer printed circuit board.

17. The method of claim 11, wherein each of the patches of the first and second frequency selective EBGs is connected to the respective first and second conductor planes by a conducting line.

18. The method of claim 17, wherein the conductive line is a conductive via.

19. The method of claim 11, further comprising providing a dielectric between the first and second conductor planes.

20. A system comprising:
a radio frequency (RF) circuit including an antenna to transmit and receive a RF signal; and
a multilayer printed circuit board (PCB) having an interference suppression structure to suppress propagation of an interference signal induced by the RF signal within a frequency band, comprising:
a first conductor plane;
a first array of periodically distributed co-planar conductive patches, each patch in the first array being connected to the first conductor plane;
a second conductor plane separated from and parallel to the first conductor plane, wherein the second conductor plane includes two or more co-planar conductor planes physically separated from each other; and
a second array of periodically distributed co-planar conductive patches, each patch in the second array being connected to the second conductor plane, wherein the first array and second array of periodically distributed co-planar elements are distributed in an overlapping and alternating adjacency.

21. The system of claim 20, wherein the first plurality of distributed patches each form a first frequency selective electromagnetic band gap (EBG) and operate to suppress frequencies of a signal in a first frequency band and the second plurality of distributed patches form a second frequency selective electromagnetic band gap (EBG) and operate to suppress frequencies of the signal in a second frequency band.

22. The system of claim 21, wherein the frequency suppressions substantially reduce a propagation of the interference signal omni-directionally throughout the first or second conductor planes.

23. The system of claim 21, wherein the first frequency band and the second frequency band have a bandwidth of a and b, respectively, and the first and second frequency selective EBGs together operate to suppress signals between the first and second conductor planes in a bandgap of a+b.

\* \* \* \* \*